(12) United States Patent
Li et al.

(10) Patent No.: US 9,595,474 B2
(45) Date of Patent: Mar. 14, 2017

(54) 3D IC WITH SERIAL GATE MOS DEVICE, AND METHOD OF MAKING THE 3D IC

(71) Applicant: TAIWAN SEMICONDUCTOR MANUFACTURING CO., LTD., Hsin-Chu (TW)

(72) Inventors: Chao Chieh Li, Hsinchu (TW); Ruey-Bin Sheen, Taichung (TW); Chih-Hsien Chang, New Taipei (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 14/707,420

(22) Filed: May 8, 2015

(65) Prior Publication Data

US 2015/0243643 A1    Aug. 27, 2015

Related U.S. Application Data

(63) Continuation-in-part of application No. 14/014,472, filed on Aug. 30, 2013, now Pat. No. 9,035,464.

(51) Int. Cl.

| | |
|---|---|
| *H01L 21/822* | (2006.01) |
| *H01L 25/00* | (2006.01) |
| *H01L 25/065* | (2006.01) |
| *H01L 23/48* | (2006.01) |
| *H01L 27/06* | (2006.01) |
| *H01L 27/088* | (2006.01) |

(52) U.S. Cl.
CPC ........ *H01L 21/8221* (2013.01); *H01L 23/481* (2013.01); *H01L 25/0657* (2013.01); *H01L 25/50* (2013.01); *H01L 27/0688* (2013.01); *H01L 27/088* (2013.01); *H01L 2225/06541* (2013.01); *H01L 2924/0002* (2013.01)

(58) Field of Classification Search
CPC .............. H01L 21/8221; H01L 23/481; H01L 23/5226; H01L 23/528; H01L 25/0657; H01L 27/10802; H01L 27/0688; H01L 27/11514; H01L 27/11551; H01L 27/11568; H01L 27/11578
See application file for complete search history.

(56) References Cited

U.S. PATENT DOCUMENTS

| | | | |
|---|---|---|---|
| 6,590,423 B1 * | 7/2003 | Wong ................. | H03K 19/0963 326/93 |
| 6,600,173 B2 * | 7/2003 | Tiwari ............. | H01L 21/76254 257/347 |
| 7,723,207 B2 | 5/2010 | Alam et al. | |
| (Continued) | | | |

*Primary Examiner* — Eduardo A Rodela
(74) *Attorney, Agent, or Firm* — Duane Morris LLP; Steven E. Koffs

(57) ABSTRACT

A die stack comprises a first integrated circuit (IC) die having at least a first device comprising a first source, a first drain and a first gate electrode above a first channel region between the first source and the first drain. A second IC die has at least a second device comprising a second source, a second drain and a second gate electrode above a second channel region between the second source and the second drain. The second gate electrode is connected to the first gate electrode by a path including a first through substrate via (TSV), the second drain connected to the first source by a path including a second TSV.

19 Claims, 10 Drawing Sheets

(56) References Cited

U.S. PATENT DOCUMENTS

| | | | |
|---|---|---|---|
| 8,071,438 B2 * | 12/2011 | Lee | H01L 21/2007 257/E21.506 |
| 8,237,228 B2 * | 8/2012 | Or-Bach | G03F 9/7076 257/369 |
| 8,653,641 B2 | 2/2014 | Chen et al. | |
| 9,035,464 B2 * | 5/2015 | Li | H01L 23/481 257/774 |
| 2011/0241132 A1 | 10/2011 | Akimoto | |
| 2013/0193488 A1 | 8/2013 | Or-Bach et al. | |

* cited by examiner

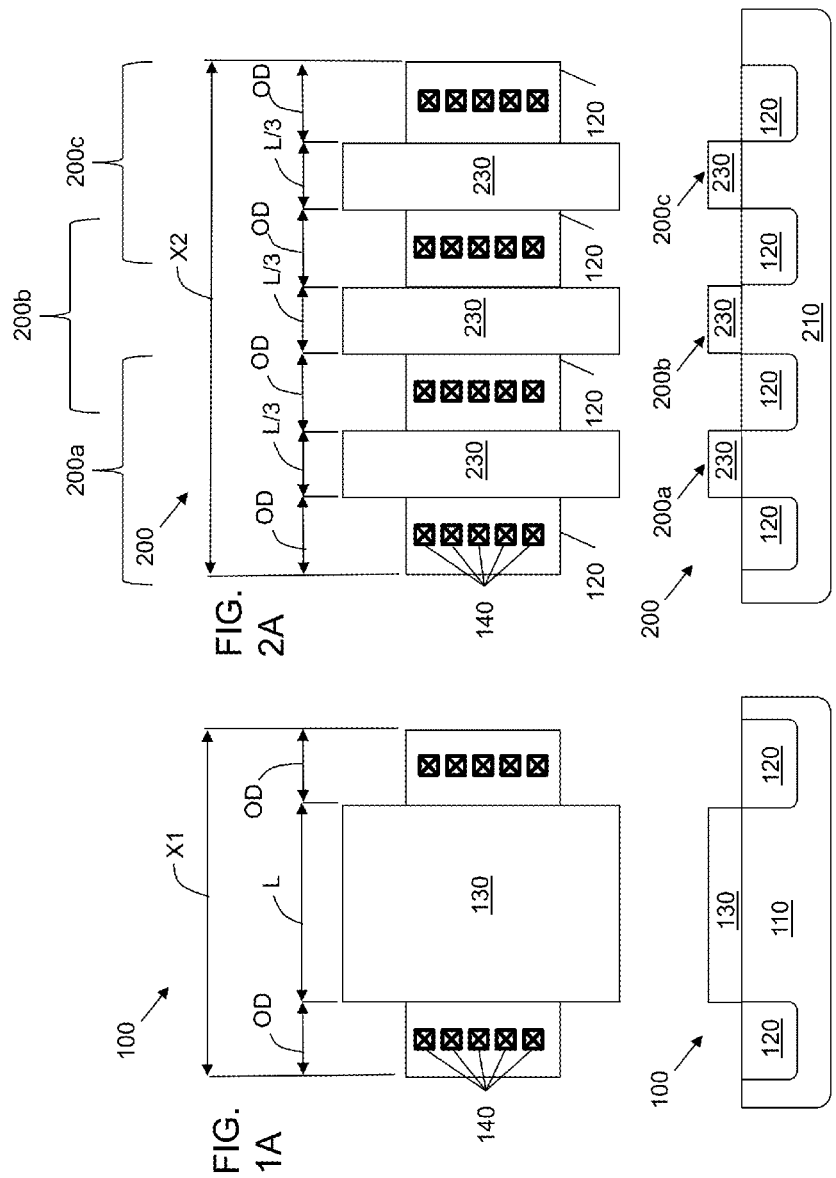

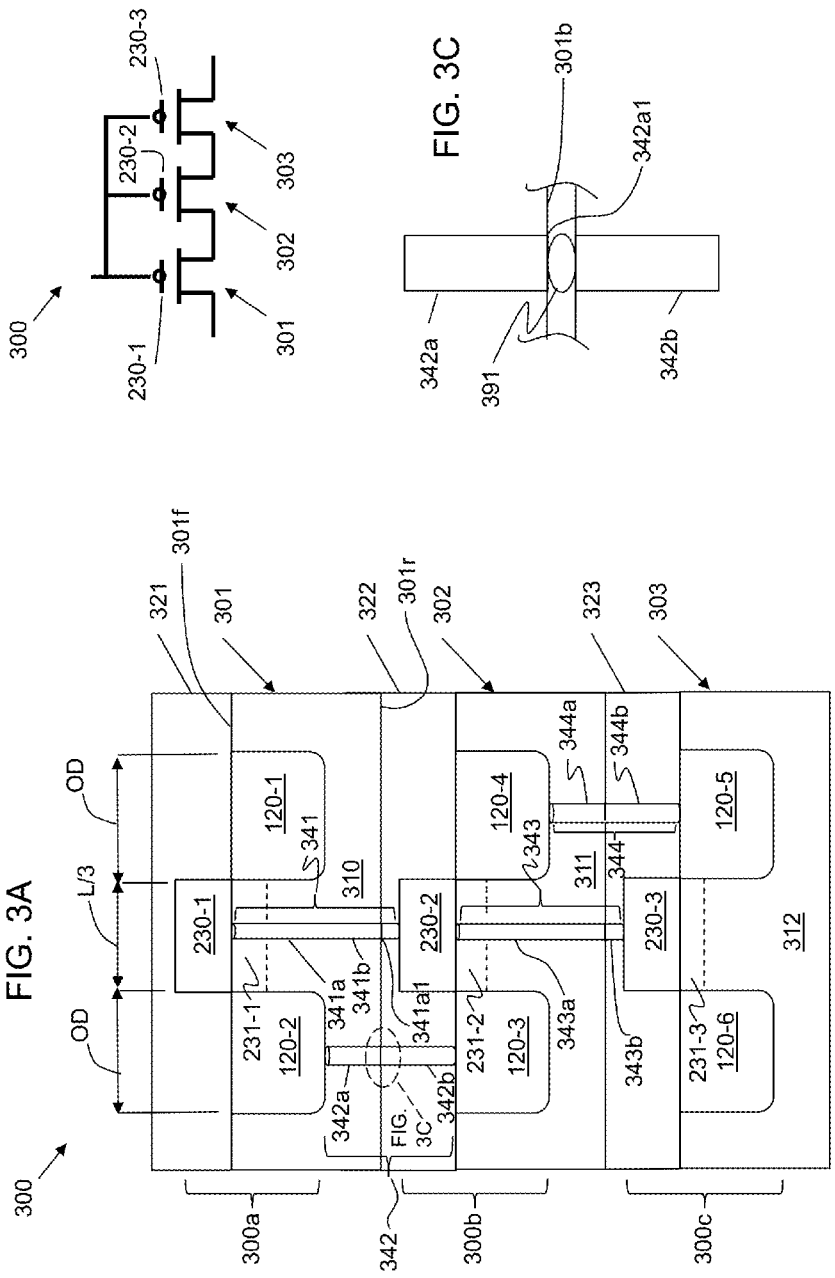

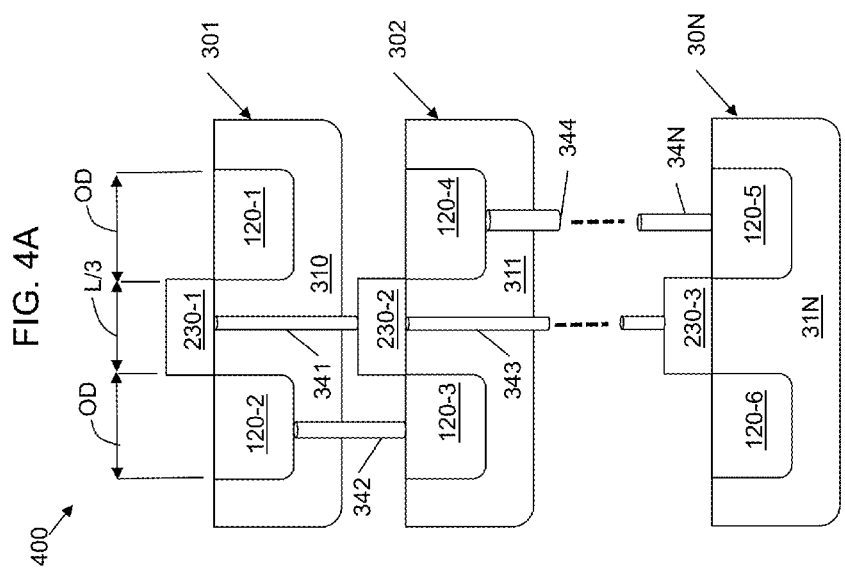

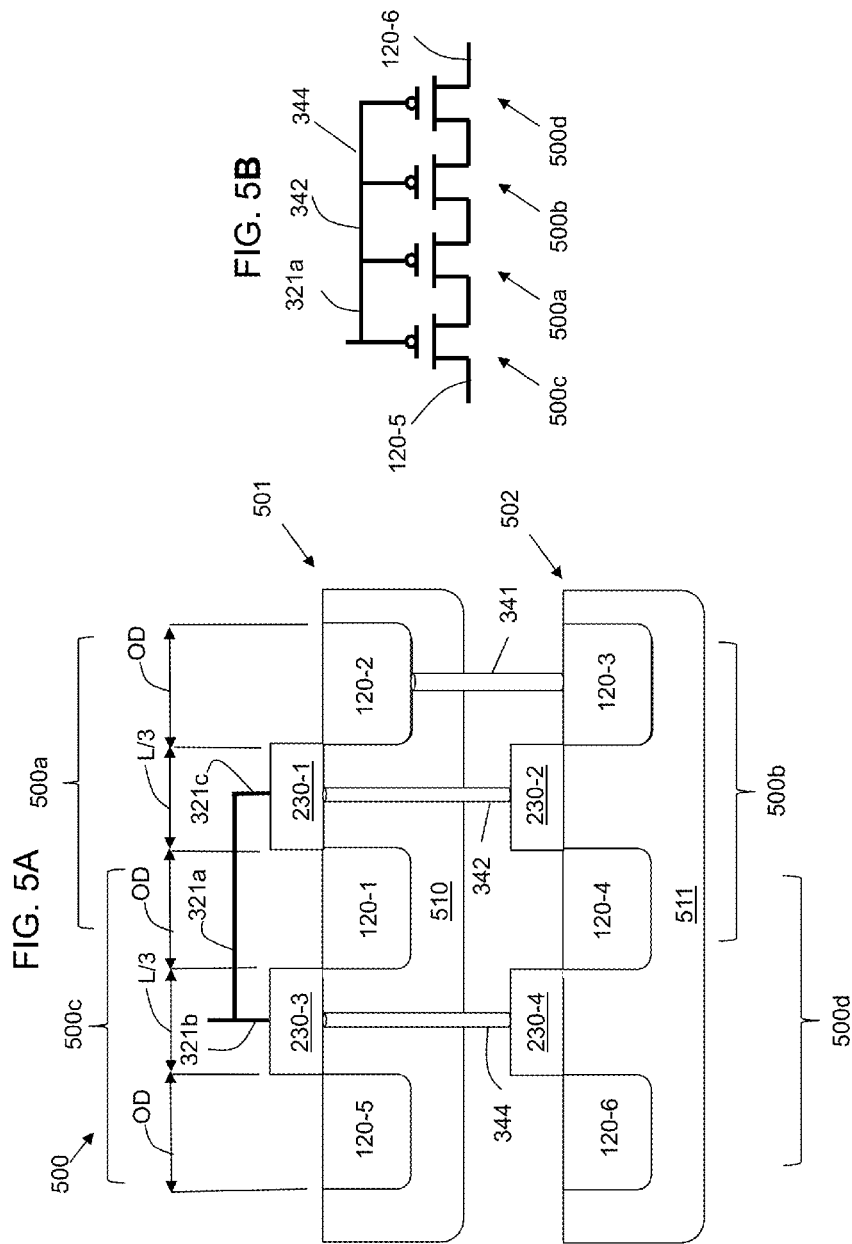

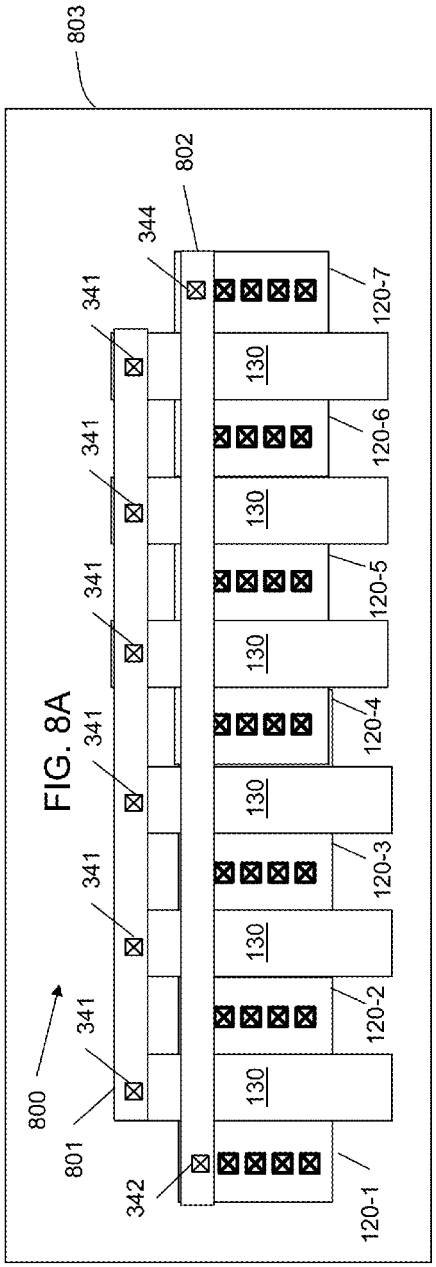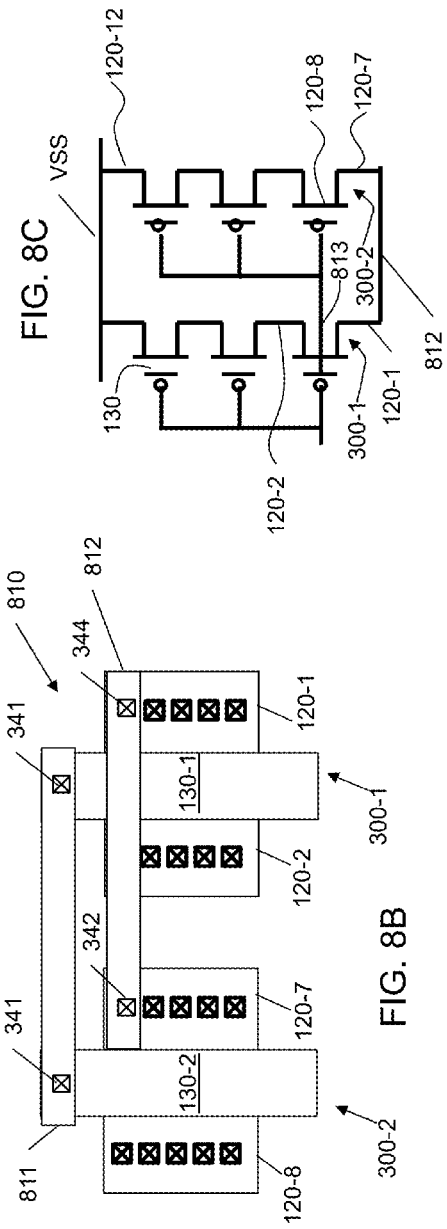

US 9,595,474 B2

3D IC WITH SERIAL GATE MOS DEVICE, AND METHOD OF MAKING THE 3D IC

REFERENCE TO RELATED APPLICATIONS

This application is a continuation-in-part of U.S. patent application Ser. No. 14/014,472, filed Aug. 30, 2013, which is expressly incorporated by reference herein in its entirety.

BACKGROUND

This disclosure relates generally to semiconductor devices, and more specifically three dimensional integrated circuits (3D IC) Many semiconductor integrated circuits (ICs) include analog circuits, such as current mirrors and differential buffers or comparators. To reduce mismatch and improve the source-to-drain resistance (Rout), designers often use a large gate length for active devices (e.g., transistors). In advanced semiconductor processes, device sizes are reduced, including the gate length. The reduction in gate length can increase mismatch and/or affect Rout.

BRIEF DESCRIPTION OF THE DRAWINGS

FIGS. 1A and 1B are plan and cross-sectional views of a MOS device according to an embodiment of this disclosure.

FIGS. 2A and 2B are plan and cross-sectional views of a serial gate MOS device having shorter individual gate lengths, according to an embodiment of this disclosure.

FIG. 3A is a cross-sectional view of a 3D IC having stacked dies with serial gate MOS devices according to an embodiment of this disclosure.

FIG. 3B is a schematic diagram of the circuit of FIG. 3A.

FIG. 3C is an enlarged detail of FIG. 3A in some embodiments of the present disclosure.

FIG. 4A shows another 3D IC example having N stacked dies, according to some embodiments of the present disclosure.

FIG. 4B is a schematic diagram of the serial gate MOS device of FIG. 4A in some embodiments of the disclosure.

FIG. 5A shows another 3D IC example having stacked dies and horizontal serial gate dies, according to some embodiments of the present disclosure.

FIG. 5B is a schematic diagram of the serial gate MOS device of FIG. 5A, according to some embodiments of the present disclosure.

FIG. 8A shows a serial gate MOS device having six transistors in series, according to some embodiments of the present disclosure.

FIG. 8B is a plan view of a serial gate MOS device including two of the devices of FIG. 3A, connected to each other in an interconnect layer or redistribution layer, according to some embodiments of the present disclosure.

FIG. 8C is a schematic diagram of the circuit in FIG. 8B, according to some embodiments of the present disclosure.

DETAILED DESCRIPTION

Figure 3E:
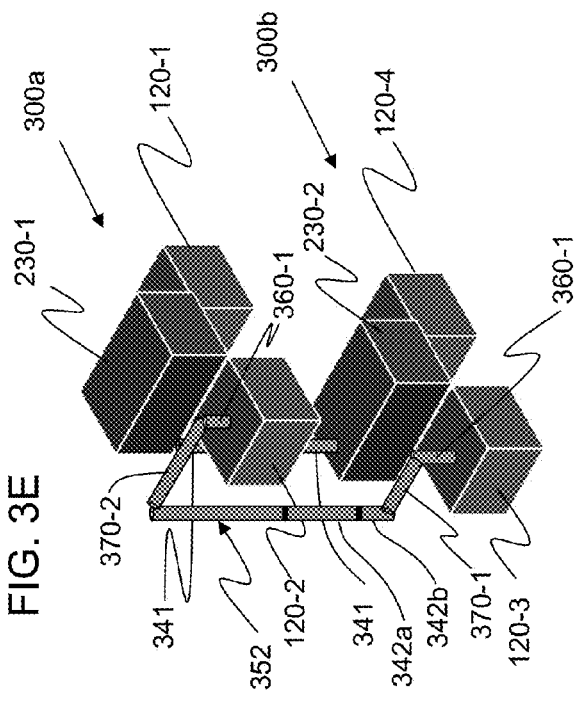
FIG. 3E is an isometric view of the dies of FIG. 3D, with an alternative path forming the source-to-drain series connection between devices on the two dies, according to another embodiment of the present disclosure.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

In the various figures, like reference numerals indicate like structure, unless expressly stated otherwise.

FIGS. 1A and 1B are plan and cross-sectional views of a MOS device 100 according to an embodiment of this disclosure. The MOS device can be a p-MOSFET (metal oxide semiconductor field effect transistor), an n-MOSFET, or a varactor (also referred to as a MOScap). In a varactor, the source and drain of the device are connected to each other. For illustration, MOS devices include, but are not limited to, an n-MOSFET, a p-MOSFET, or a varactor, or combinations thereof.

The MOS device 100 has a semiconductor substrate 110. In various embodiments, the substrate 110 can be, for example, any of a silicon substrate, a III-V compound substrate, a semiconductor over insulator (SOI) substrate, a glass substrate, or any other semiconductor substrate.

The MOS device has a gate insulating layer (not shown) on the substrate 110, with a gate electrode 130 over the gate insulating layer. In some embodiments, the gate electrode 130 comprises a material such as doped polysilicon, undoped polysilicon, amorphous silicon or the like; and the gate insulating layer is a dielectric such as a silicon oxide or silicon oxynitride. In other embodiments, the gate electrode 130 comprises a metal material, and the gate insulating layer comprises a high-k dielectric material.

The substrate 110 has a respective region 120 on each side of the gate electrode 130. The regions 120 are doped to serve as the source and drain regions. If the MOS device is an N-MOSFET, then the source and drain regions 120 are 'n+' regions and the substrate 110 is a 'p' region. If the MOSFET is a p-MOS FET, then the source and drain are 'p+' regions and the substrate 110 is an 'n' region. The source and drain regions 120 have a plurality of contacts 140 to provide connections to external pins and/or the interconnect structure of the IC.

In the device 100 of FIGS. 1A and 1B, the gate has a length L in the horizontal direction, so that the total length X1 of the device 100 is given by:

$$X=L+2*OD,$$

where OD is the length of the oxide definition regions serving as the source and drain regions 120.

In some embodiments (e.g., 45 nm technology node), the gate length of the MOS devices is 35 nm or less. FIGS. 2A and 2B are plan and cross sectional views of an example of an embodiment of a MOS device 200 having a gate length L/3.

In the device 200 of FIG. 2A, the gate length is ⅓ of that of the device 100 in FIG. 1A. To maintain the analog performance in ICs fabricated by advance processes (e.g., to avoid increase in mismatch or degradation in Rout), designers can use a series MOS technique, connecting a plurality of transistors 200a-200c in series on the same substrate 210. The device 200 has a substrate 210 with three MOS devices (e.g., transistors) 200a-200c. Each transistor 200a-200c has source/drain regions 120 and a gate electrode 230 of length L/3. The source/drain regions 120 between successive gates 230 are shared. That is, the source region 120 of transistor 200a also serves as the drain region of transistor 200b. The resistance of a transistor is proportional to its gate length. By tying the gate electrodes 230 of the three transistors 200a-200c together, the transistors 200a-200c can be biased at the same time, so that the total resistance of the three transistors 200a-200c (each of gate length L/3) is about the same as the resistance of the single transistor 100 (of gate length L) shown in FIG. 1A. The total length X2 of the device 200 is given by:

$$X=3*L/3+4*OD=L+4*OD$$

This total device length X2 is longer than the length X1 of device 100 (FIG. 1A) by 2*OD. Further, the larger the number of series MOS devices, the greater the increase in total length of the serial gate MOS devices, and the greater the chip area. For example, a device having N devices formed in series has a length that exceeds the length of device 100 by (N−2)*OD.

The use of a gate length of L/3 in the above example is non-limiting. Any of the embodiments described herein can use devices of any technology level and gate length. Nevertheless, for ease of illustration, the examples below also use MOS devices having gate length of L/3, solely for ease of comparison with each other. The examples below thus reference a baseline technology having a gate length L and an some embodiments having gate length L/3.

FIG. 3A shows a die stack 300 of a 3D IC comprising three stacked dies 301-303. For ease of illustration, FIG. 3A shows one MOS device (e.g., a transistor or varactor) 300a-300c in each respective die 301-303. Each die can include any number of devices. Also, for ease of illustration, the intermetal dielectric (IMD) layers and interconnect structure of each die 301-303 is represented by a respective single layer 321-323. This is not limiting. Each die can have any number of IMD layers, such as 8-14 IMD layers, for example.

In various embodiments, the dielectric layers 321-323 each comprise an oxide material, an oxynitride material, a low-k dielectric material, an extreme low-k dielectric, or any combination thereof. In some embodiments, each die 301-303 is formed by the same process, and each of the dielectric layers 321-323 include the same intermetal dielectric (IMD) material. In other embodiments, the various dies 301-303 are made by two or more different process technologies, and include two or more different intermetal dielectric materials.

In some embodiments, a three dimensional integrated circuit (3D IC) 300 comprises a first IC die 301 having at least a first transistor 300a comprising a first gate electrode 230-1, and a second IC die 302 having at least a second transistor 200b comprising a second gate electrode 230-2. A path 341 including a first TSV 341a connects the second gate electrode 230-2 to the first gate electrode 230-1. A path 342 including a second TSV 342a connects the second transistor 300b in series to the first transistor 300a. In other embodiments, the MOS devices 300a, 300b are varactors.

The dies stack 300 includes a first integrated circuit (IC) die 301 having at least a first device 300a. The device 300a comprises a first drain 120-1, a first source 120-2, and a first gate electrode 230-1. The first gate electrode 230-1 is formed above a first channel region 231-1 between the first source 120-2 and the first drain 120-1.

A second IC die 302 has at least a second device 300b. The second device 300b comprises a second drain 120-3, a second source 120-4, and a second gate electrode 230-2. The second gate electrode 230-2 is formed above a second channel region 231-2 between the second source 120-3 and the second drain 120-4.

The second gate electrode 230-2 is connected to the first gate electrode 230-1 by a path 341 including a first through substrate via (TSV) 341a. In some embodiments, the path 341 further includes one or more of a contact, a conductive via or a conductive line 341b or a combination thereof. For example, in FIG. 3A, the TSV 341a extends through the substrate 310 to contact the gate electrode 230-1 outside of the first channel region 231-1 and the second channel region 231-2 (as best seen in FIG. 3D). A microbump 391 (such as the solder microbump 391 shown in FIG. 3C) connects the TSV 341a to a contact or via 341b on the face of IC die 302.

The second drain 120-3 is connected to the first source 120-2 by a path 342 including a second TSV 342a. In some embodiments, the path 342 further includes one or more of a contact, a conductive via or a conductive line 342b or a combination thereof. For example, in FIG. 3A, the TSV 342a extends through the substrate 310 to connect to a contact or via 342b. A microbump 391 connects the TSV 342a to the contact or via 342b on the face of IC die 302.

For ease of illustration, a detailed view of the microbump interface is only shown for the path 342 in FIG. 3C. However, one of ordinary skill understands that that each of the paths 341-344 in FIG. 3A includes a similar microbump interface between a TSV in one of the dies 301-303 and a contact or via in the adjacent die. In some embodiments, the microbump is formed on the back side of the TSV 341a, designated 341a1 (opposite the IMD layers), and subsequently heated to reflow the microbumps when the dies 301 and 302 are joined. In other embodiments, the microbump is formed over the contact or via 341b of the second die, and subsequently heated to reflow the microbumps when the dies 301 and 302 are joined.

In some embodiments, the 3D IC has a third IC die 303. The IC die 303 has at least a third device 300c comprising a third drain 120-5, a third source 120-6, and a third gate electrode 230-3. The third gate electrode 230-3 is formed above a third channel region 231-3 between the third source 120-6 and the third drain 120-5. A path 343 connects the third gate electrode 230-3 to the second gate electrode 230-2. The path 343 includes a third TSV 343a. In some embodiments, the path 343 further includes one or more of a contact, a conductive via or a conductive line 343b or a combination thereof. For example, in FIG. 3A, the TSV 343a extends through the substrate 311 to contact the gate electrode 230-2 outside of the second channel region 231-2 and the third channel region 231-3. A microbump 391 connects the TSV 343a to a contact or via 343b on the face of IC die 303.

A path 344 connects the third drain 120-5 to the second source 120-4. The path 344 includes a fourth TSV 344a. In some embodiments, the path 343 further includes one or more of a contact, a conductive via or a conductive line 343b or a combination thereof. For example, in FIG. 3A, the TSV

343a extends through the substrate 311 to connect to a contact or via 343b. A microbump 391 connects the TSV 343a to the contact or via 343b on the face of IC die 303.

In some embodiments, the first drain 120-1 is directly above the second source 120-4, the first gate electrode 230-1 is directly above the second gate electrode 230-2, and the first source 120-2 is directly above the second drain 120-3. In some embodiments, the second drain 120-3 is directly above the third source 120-6, the second gate electrode 230-2 is directly above the third gate electrode 230-3, and the second source 120-4 is directly above the third drain 120-5. With the MOS devices in the various dies aligned in this manner, the total horizontal length of the serial gate MOS device 300 is minimized. In other embodiments (not shown), the MOS devices in one of the stacked dies are offset from the MOS devices in another die. A corresponding increase in total horizontal length of the serial gate MOS device depends on the size of the offset.

FIG. 3B is a schematic diagram of the structure of FIG. 3A. The 3D IC 300 has three MOS devices 300a-300c (e.g., transistors or varactors) connected in series, with their gate electrodes 230-1 to 230-3 connected to each other. As shown in FIG. 3A, the device 300 has the same total length (=L/3+2*OD) as the single MOS device 100 of FIG. 1A. Thus, by spreading the serial gate MOS devices 300a-300c across plural stacked dies 301-303, the configuration of FIG. 3A reduces the horizontal dimension of the serial gate MOS devices 301-303, and reduces the chip area.

Figure 3D:
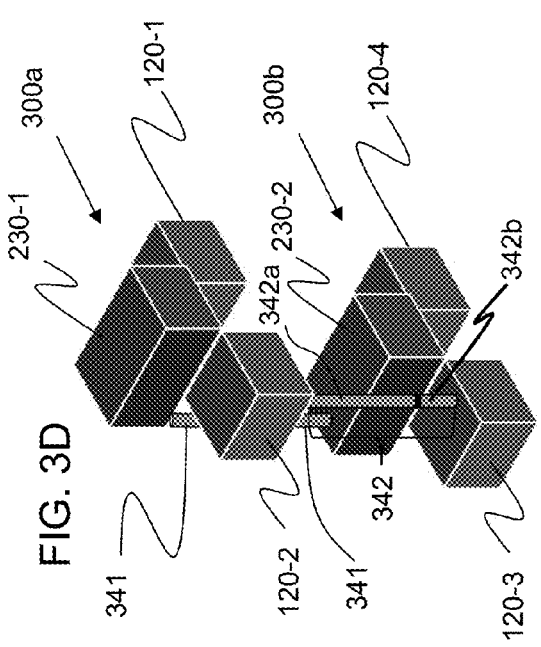
FIG. 3D is an isometric view of two of the dies in FIG. 3A in some embodiments.

FIGS. 3D and 3E show examples of configurations for the paths 342, 352 (including the TSV 342a) connecting adjacent gate electrodes, and connecting a source region 120-2 to a drain region 120-3 of an adjacent die 302.

In the configuration of FIG. 3D, the path 342 extends along a straight line, and includes a TSV 342a in the die 301 and a contact and/or via 342b in the interconnect structure 322 of the die 302. For example, in some embodiments, the second die 302 has a contact extending from the source region 120-2 to the bottom of the Via-0 layer, and vias extending to the surface of the die 302. The TSV 342a extends from the location 342a1 at the back face 301b (FIG. 3C) of the first die 301 up to at least the bottom of the source region 120-1. This structure is used in some process technologies for which the TSV depth is controlled, so the TSV does not extend all the way through the source region.

In the configuration of FIG. 3E, the path 352 has a contact 360-1 connected to a conductive line 370-1 (within the dielectric layer 322). The vertical segment of the path 352 includes a TSV 342a in the die 300 and a via 342b within the second die 302. In the example of FIG. 3E, the vertical segment 342a, 342b is offset from the source/drain regions 120-2, 120-3, allowing an interconnection to the top surface of the source region 120-2 and the top surface of drain region 120-3. A contact 360-1 and a conductive line 370-2 (in the intermetal dielectric 321, FIG. 3A) complete the connection between the source region 120-2 and the drain region 120-3. This structure can be formed using a process technology for which the TSV 342a extends from the front face 301f (shown in FIG. 3A) of the substrate 310 to the rear face 301r (shown in FIG. 3A) of the substrate 310.

FIGS. 3D and 3E are only two examples of connections between serial gate MOS devices in adjacent stacked dies. One of ordinary skill in the art (or an automatic place and route EDA tool) can use a different path (including a TSV, not shown) to connect vertically aligned source and drain regions in adjacent dies.

The 3D IC is not limited to including three dies. In some embodiments, as shown in FIGS. 4A and 4B, the 3D IC includes N dies, where N is any integer greater than one. For purpose of brevity and ease of illustration, the intermetal dielectric layers 321-323 are omitted from FIG. 4A, but are included in a complete 3D IC. The dies 301 and 302 are the same as described above with reference to FIG. 3A, and their descriptions are not repeated.

The remaining dies up to die 30N contain an MOS device having a respective source (e.g., 120-6), a respective drain (e.g., 120-5) and a gate electrode (e.g., 230-3). Each gate electrode is connected to the gate electrode(s) of the adjacent die(s) in the 3D IC by a respective path that includes a TSV (e.g., 341a, 342a, 343a) outside of the channel region. Each source region (e.g., 120-4) at or above die N−1 is connected to the drain region immediately below that source region in the adjacent die below by a path including a TSV. FIG. 4B shows an electrical representation of structure in FIG. 4A, which has N of the MOS device connected in series, with their gate electrodes tied together.

Thus, according to the embodiment of FIGS. 4A and 4B, given a technology node with a gate length L, and another technology node with a gate length L/N, a serial gate MOS device having total gate length L is implemented in some embodiments by including one MOS device in each of N stacked dies, and connecting the MOS devices in series. Within each pair of adjacent dies, a respective path including a TSV connects the source of the device in the upper die to the drain of the device in the adjacent lower die. Within each pair of adjacent dies, a respective path including a TSV connects the gate electrode of the devices in the upper die to the gate electrode of the device in the adjacent lower die. Regardless of the number of MOS devices, the serial gate MOS device is implemented with a total horizontal length of L+2*OD, where L is the gate length, and OD is the length of the source and drain regions.

In a design process for a serial gate MOS device as described herein, the designer can reduce the horizontal dimensions of the serial gate MOS devices for a given number of dies in the 3D IC. Also, the designer may desire to increase the total gate length L (FIG. 2B) of the serial gate MOS device. FIG. 5A shows a configuration which combines vertical and horizontal serial gate MOS devices. This permits the designer to minimize the total horizontal length of the serial gate MOS device for a given number of available dies.

Referring now to FIG. 5A, a serial gate MOS device 500 includes two IC dies 501, 502 with respective substrates 510, 511, and four MOS devices 500a-500d. For ease of illustration, the IMD layers and interconnect structure are omitted from FIG. 5A, but they are included in the device 500.

Consider the right MOS device 500a in top die 501 (including drain 120-1, source 120-2 and gate electrode 230-1) and the right MOS device 500b in the bottom die 502 (including drain 120-3, source 120-4 and gate electrode 230-2). The structure of first MOS device 500a and second MOS device 500b is the same as the structure of devices 300a and 300b in FIG. 3A, and detailed discussion of this structure is not repeated for brevity. In the embodiment of FIG. 5A, however, the top die 501 has an added (third) MOS device 500c, which includes a source region 120-5 and a gate electrode 230-3. The source region 120-1 of device 500a serves as the drain region of MOS device 500c. Thus, the third and first MOS devices 500c and 500a are connected in series. Also, the bottom die 502 has an added (fourth) MOS device 500d, which includes a source region 120-6 and a gate electrode 230-4. The source region 120-4 of device 500b serves as the drain region of MOS device 500d. Thus, MOS devices 500b and 500d are connected in series. A path 344 (including at least a TSV outside of the channel region in the first die 301) connects the third gate electrode 230-3 to the fourth gate electrode 230-4.

In other embodiments (not shown), additional series gate MOS devices are added to the left of device 500c in the top die 501, and to the left of device 500d in the bottom die 502.

FIG. 5B is a schematic diagram of the series gate MOS device 500. The MOS devices 500c, 500a, 500b and 500d are connected in series.

Thus, given one embodiment with a gate length L, and another embodiment as shown in FIG. 5 with a gate length L/N, and the number of available dies in the dies stack equal to J, a serial gate MOS device having a desired total gate length X is implemented using the embodiment of FIG. 5. The number of MOS devices (having the individual gate length L/N) that provide the desired total gate length X is X/(L/N). The number of serial MOS devices per die is determined by dividing the total number of MOS devices [X/(L/N)] by the number of dies J.

$$\text{Devices per die} = X / [(L/N) * J]$$
$$= [(N*X)/(J*L)]$$

Thus, in the some embodiments, the serial gate MOS device is implemented including [(N*X)/(J*L)] MOS devices in each of J stacked dies, where the [(N*X)/(J*L)] MOS devices within each die are series gate MOS devices. Within each pair of adjacent dies, a path including a TSV connects the gate electrode of the devices in the upper die to the gate electrode of the device in the adjacent lower die. Within each pair of adjacent dies, a path including a TSV connects the source of one of the device in the upper die to the drain of the immediately adjacent device in the adjacent lower die. That is, the last source in each upper die is connected to the first drain in the adjacent lower die by a path including a TSV.

The total horizontal length is given by $$(\text{number of devices per die}) * (\text{gate length per device}) +$$
$$(\text{number of devices per die} + 1) * OD. =$$
$$[(N*X)/(J*L)] * L/N + [(N*X)/(J*L) + 1] * OD$$

For example, in FIG. 5A, assume that the gate length for some embodiments is L/3, the total desired gate length X for the serial gate MOS device is 4L/3, the number of dies (J) is 2. The gate length is ⅓ of the baseline gate length L, so N=3. The number of devices per die is given by:

$$(N*X)/(J*L) = [3*(4L/3)]/(2*L)$$
$$= 2$$

The total horizontal length is given by:

$$[(N*X)/(J*L)] * L/N + [(N*X)/(J*L) + 1] * OD =$$
$$[(3*4L/3)/(2*L)] * L/3 + [(3*4L/3)/(2*L) + 1] OD =$$
$$(4L/2L) * L/3 + \{[4L/2L] + 1\} * OD = 2L/3 + 3OD$$

Figure 6:
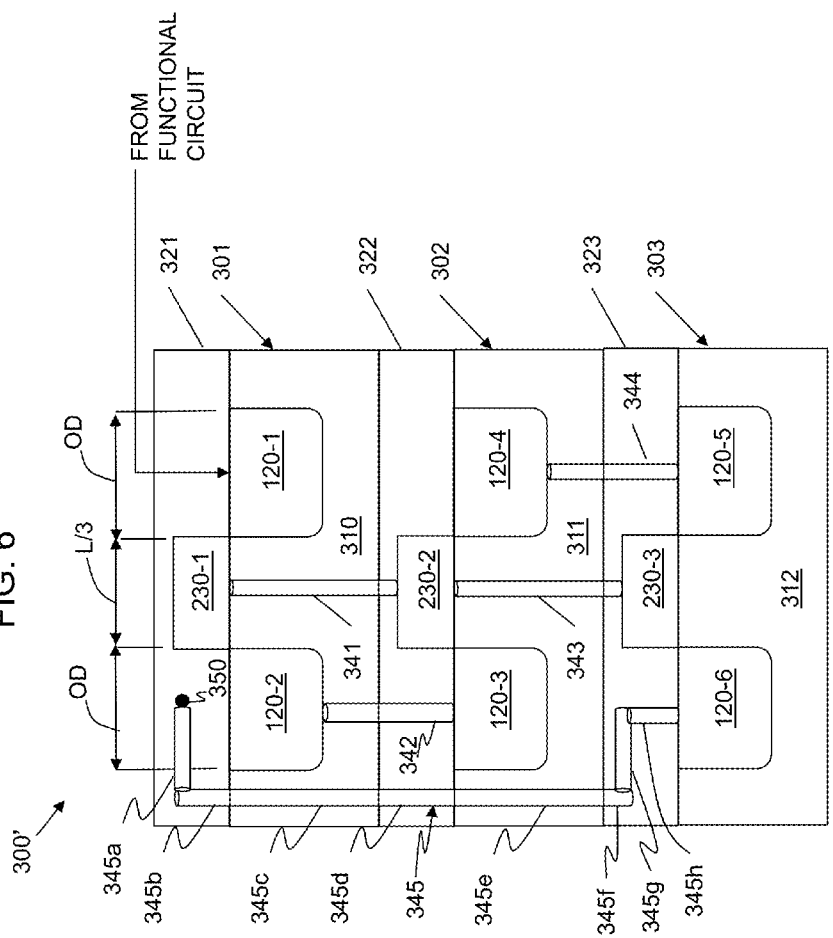
FIG. 6 shows a variation of the 3D IC of FIG. 3A, according to some embodiments of the present disclosure.
Figure 7:
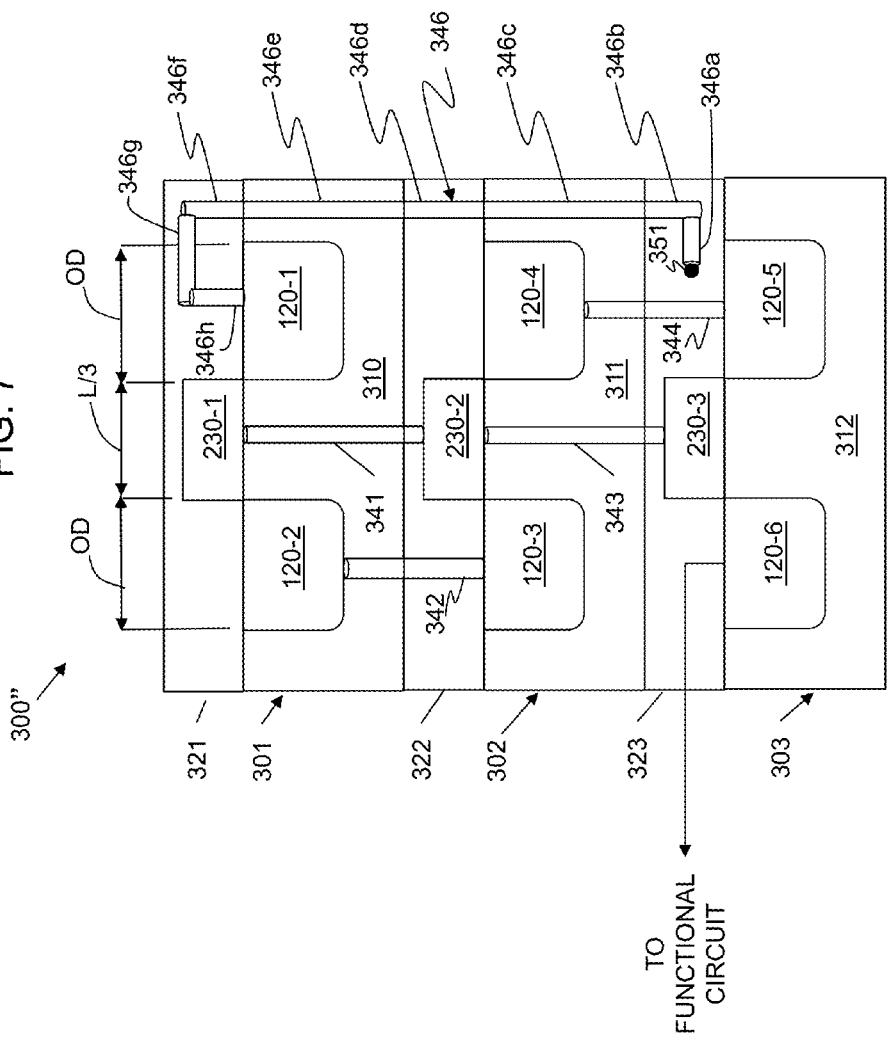
FIG. 7 shows another variation of the 3D IC of FIG. 3A, according to some embodiments of the present disclosure.

In the device described above with reference to FIG. 3A, the first drain 120-1 of the serial MOS gate device is in the first die 301, and the last source 120-6 is in the third die 303. Such an approach is useful, when the designer wants to connect the serial gate MOS device to a first circuit in the first die 301 and a second circuit in the third die 303. FIGS. 6 and 7 show embodiments which the designer can use to connect the serial gate MOS device between a first circuit in one of the dies 301-303 and a second circuit in the same die.

FIG. 6 shows a serial gate MOS device 300', which is variation of the device 300 of FIG. 3A. Like numbered items are indicated by like reference numerals, and descriptions thereof are not repeated.

Compared with the device 300, the device 300' further comprises a fifth TSV 345c in the first die 301 and a sixth TSV 345e in the second die 302. The third source 120-6 of die 303 is connected to a node 350 in the first die 301 by path 345 including the fifth and sixth TSVs 345c, 345e and at least one of a contact, a via or a conductive line in the second die 302 and at least one of a contact, a via or a conductive line in the third die 303. The node 350 is an example, and can correspond to a point on a device or interconnect line or via in the first IC die 301. Thus, a series gate MOS device 300' having its first drain 120-1 connected to a functional circuit in die 301 has its final source in the third die. The path 345 connects the final source 120-6 of the series gate MOS device 300' to the node 350 in the first die, to connect to the functional circuit. The functional circuit can be an analog or digital circuitry, such as logic or memory, for example.

For example, in the device 300', the path 345 comprises: a conductive (metal) line 345a and a via 345b in the IMD layer 321, TSV 345c in die 301, a via 345d in IMD layer 322, TSV 345e in die 302, and a via 345f, a conductive line 345g and a contact 345h in IMD layer 323. In some embodiments, the path 345 includes additional conductive lines and/or vias to facilitate routing within one or more of the IC dies 301-303. Thus, according to the embodiment of FIG. 6, functional circuitry in the top die 301 connects to a serial gate MOS device which is divided among a plurality of IC dies including the top die.

FIG. 7 shows a serial gate MOS device 300", which is another variation of the device 300 of FIG. 3A, in which functional circuitry in the bottom die 303 connects to a serial gate MOS device which is divided among a plurality of IC dies including the bottom die. Like numbered items are indicated by like reference numerals, and descriptions thereof are not repeated.

Compared with the device 300, the device 300" further comprises a fifth TSV 346e in the first die 301 and a sixth TSV 346c in the second die 302. The first drain 120-1 of first die 301 is connected to a node 351 in the third die 301 by path 346 including the fifth and sixth TSVs 346e, 346c and at least one of a contact, a via or a conductive line in the second die 302, and at least one of a contact, a via or a conductive line in the first die 301. The node 351 is an example, and can correspond to a point on a device or an interconnect line or via in the third IC die 303. Thus, a series gate MOS device 300" having its third source 120-6 connected to a functional circuit in die 303 has its initial drain in the first die. The path 346 connects the initial drain 120-1 of the series gate MOS device 300" to the node 351 in the third die, to connect to the functional circuit.

For example, in the device 300", the path 346 comprises: a conductive (metal) line 346a and a via 346b in the IMD layer 323, TSV 346c in die 302, a via 346d in IMD layer 322, TSV 346e in die 301, and a via 346f, a conductive line 346g and a contact 346h in IMD layer 321. In some embodiments, the path 346 includes additional conductive lines and/or vias to facilitate routing within one or more of the IC dies 301-303.

FIGS. 6 and 7 show non-limiting examples, in which the functional circuitry (connected to the serial gate MOS device) is in the top die or bottom die, respectively. In other embodiments of a 3D IC having more than two stacked dies, a functional circuit in a die of the stacked dies can be connected to a serial gate MOS device which is divided among some or all of the dies in the stack. In some embodiments (not shown) the functional circuitry is located in an intermediate die (such as die 302 of FIG. 4A), and two additional paths are provided, each additional path including at least one TSV. The first additional path connects the functional circuitry in the intermediate die 302 to the first drain of the serial gate MOS device in the top die 301; a second additional path connects the last source in the bottom die 303 to the functional circuitry in the intermediate die 302.

FIGS. 8A to 8C show an aspect of the serial gate MOS devices.

FIG. 8A shows a serial gate MOS device 800 having six MOS devices in one IC die 803 according to some embodiments. Each device has a pair of source drain regions 120-1 to 120-7. Each device has a gate electrode 130. Vias 341 connect the six gate electrodes 130 to a conductive line 801 in one of the interconnect layers (e.g., the M1 metal layer). Vias 342, 344 connect the terminal source/drain regions 120-1 and 120-7 to a conductive line 802 in one of the interconnect layers. In some embodiments, the serial gate MOS device 800 is implemented in a single IC die.

Figure 8D:
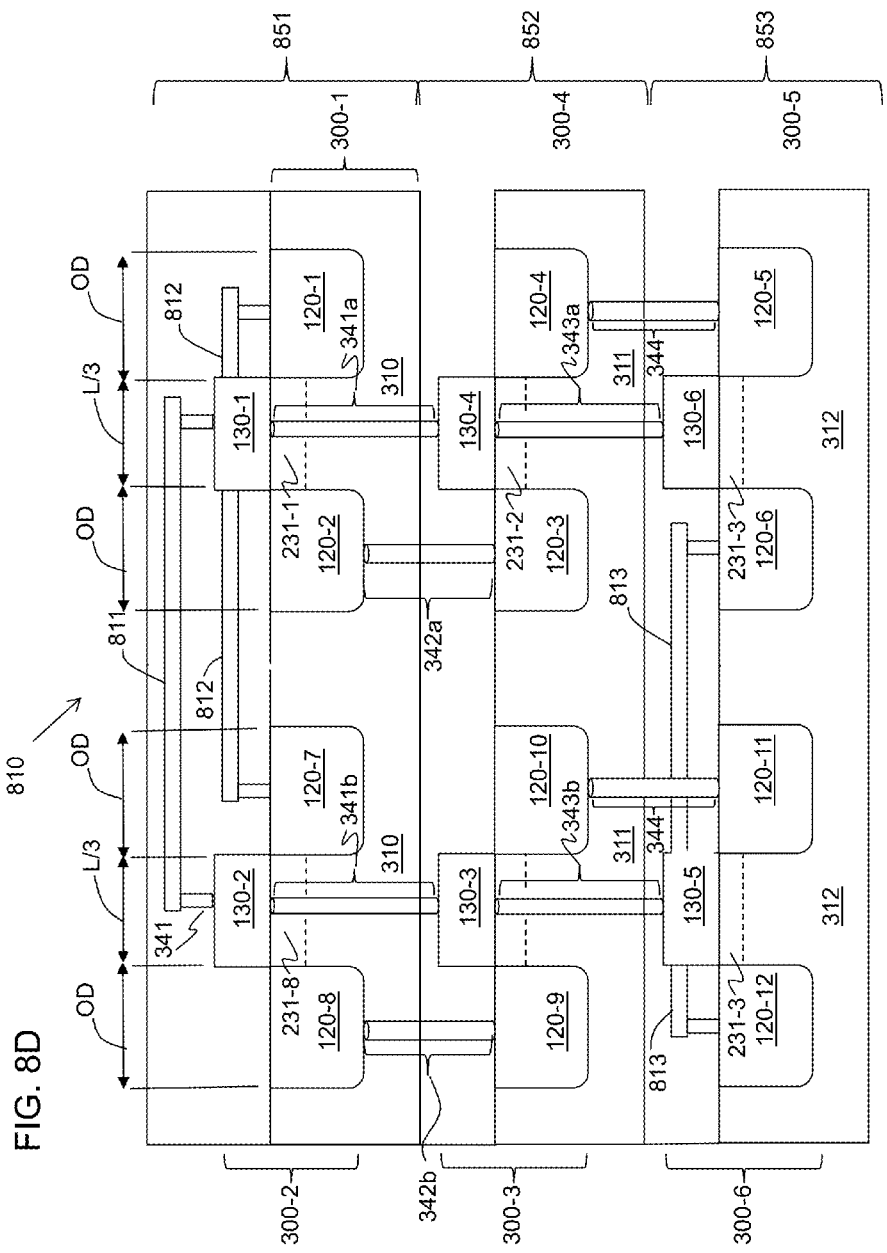
FIG. 8D is a cross-sectional view of the circuit in FIG. 8B, according to some embodiments of the present disclosure.

FIGS. 8B and 8D show a serial gate MOS device 810 having six MOS devices 300-1, 300-2, . . . , 300-6 divided among three IC dies 851-853 in the manner shown in FIG. 3A, with two devices 300 in each die. FIG. 8D is a cross-sectional view showing all three dies 851-853. FIG. 8B is a plan view of the top die. Each device 300-1, 300-2, . . . , 300-6 has a pair of source/drain regions 120-1 to 120-12. Each device has a gate electrode 130-1 to 130-6. Vias 341 connect the gate electrodes 130 to a conductive line 811 in one of the interconnect layers (e.g., the M1 metal layer). Vias 342, 344 connect the terminal source/drain regions 120-1, 120-12 to a conductive line 812 in one of the interconnect layers. The conductive interconnect pattern 812 connects the drains 120-1, 120-7 of the transistors 300-1, 300-2 in the top die 851. A conductive interconnect pattern 813 connects the sources 120-6, 120-12 of the transistors 300-5, 300-6 in the bottom die 853. FIG. 8C is a schematic diagram of the complete serial gate MOS device 810.

The device 810 of FIG. 8B, with the serial gate MOS device divided among three IC dies 851-853, has substantially shorter interconnect (metal) lines 811, 812, 813 relative to the metal lines 801, 802 of the device 800 in FIG. 8A. Thus, by dividing the serial gate MOS device 810 among multiple dies, shorter metal lines are achieved. As fabrication processes transition to smaller device geometries, reduction in the metal line length becomes even more beneficial.

Figure 9:
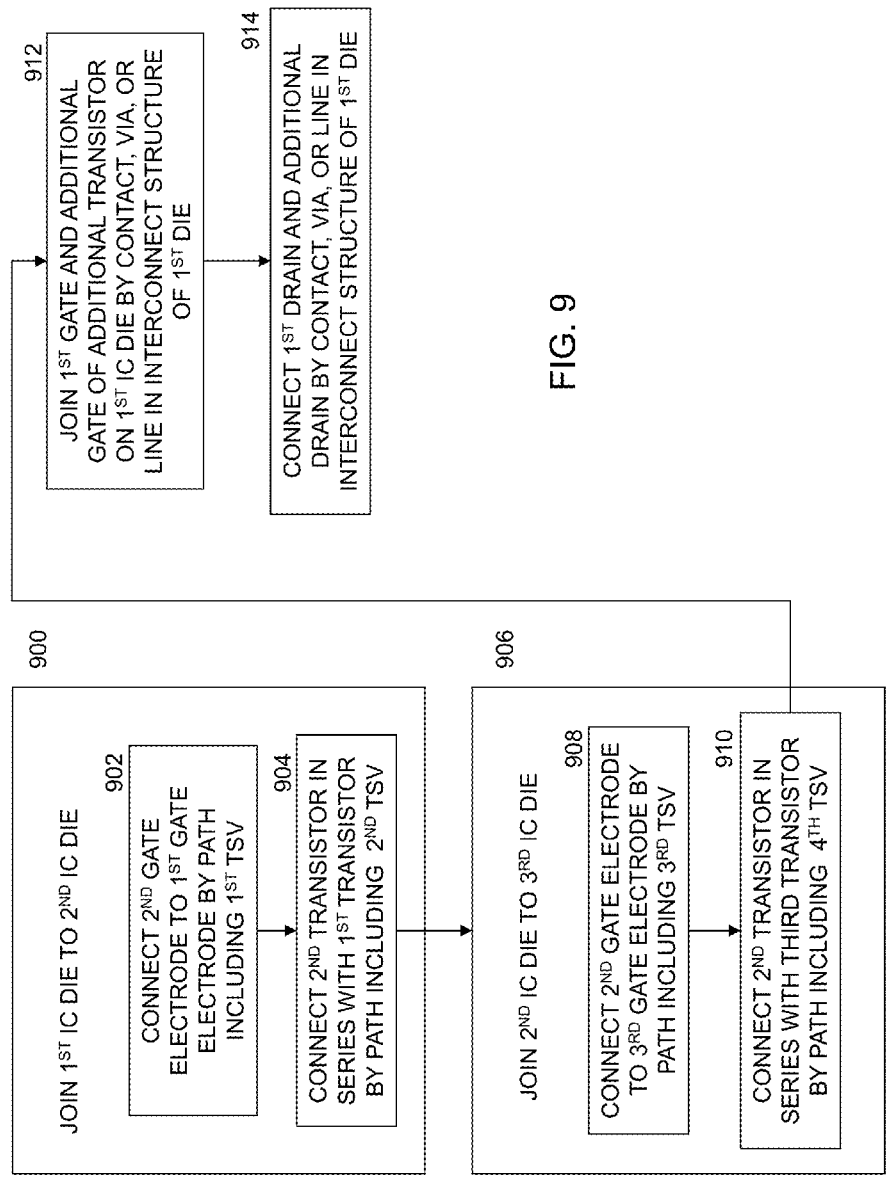
FIG. 9 is a flow chart of a method of forming a die stack, according to some embodiments of the present disclosure.

FIG. 9 is a flow chart of a method of fabricating a serial gate device in a 3D IC, as shown in FIG. 3A, 4A, or 5A, for example, according to some embodiments of this disclosure.

Step 900 joins a first integrated circuit (IC) die having at least a first transistor comprising a first gate electrode to a second IC die having at least a second transistor comprising a second gate electrode. The first transistor has a source. The second transistor has a drain. The first IC die further comprises at least one of a contact, a conductive line, or a via connecting the source of the first transistor to the second TSV. The second IC die further comprises at least one of a contact, a conductive line, or a via connecting the drain of the second transistor to the second TSV.

In some embodiments, step 900 comprises steps 902 and 904.

In step 902, the joining includes connecting the second gate electrode to the first gate electrode by a path including a first through substrate via (TSV).

In step 904, the joining further includes connecting the second transistor in series with the first transistor by path including a second TSV.

Step 906 joins the second IC die to a third IC die having at least a third transistor comprising a third gate electrode. In some embodiments, the joining includes steps 908 and 910.

At step 908, the second gate electrode is connected to the third gate electrode by a path including a third through substrate via (TSV).

At step 910, the third transistor is connected in series with the second transistor by path including a fourth TSV.

In some embodiments, the first die further comprises an additional transistor having an additional gate electrode and an additional drain. At step 912, the first gate electrode and an additional gate electrode are connected by one or more of a contact, a via or a conductive line in an interconnect structure of the first IC die.

At step 914, the first drain and the additional drain are connected by one or more of a contact, a via or a conductive line in the interconnect structure of the first IC die.

Using a serial gate MOS approach tailored for a 3D IC as described herein can reduce large chip size, including, for example, designs having one or more analog circuits. The analog circuit performance can be maintained as the process technology migrates to smaller geometries, such as the 28 nm technology node, the 20 nm technology node, or the like.

In some embodiments, a die stack comprises a first integrated circuit (IC) die having at least a first device comprising a first source, a first drain and a first gate electrode above a first channel region between the first source and the first drain. A second IC die has at least a second device comprising a second source, a second drain and a second gate electrode above a second channel region between the second source and the second drain. The second gate electrode is connected to the first gate electrode by a path including a first through substrate via (TSV), the second drain connected to the first source by a path including a second TSV.

In some embodiments, the first drain is directly above the second source, the first gate electrode is directly above the second gate electrode, and the first source is directly above the second drain.

In some embodiments, the first TSV is formed outside of the first and second channel regions.

Some embodiments further comprise a third IC die having at least a third device comprising a third source, a third drain and a third gate electrode above a third channel region between the third source and the third drain, the third gate electrode connected to the second gate electrode by path including a third TSV, the third drain connected to the second source by a path including a fourth TSV.

Some embodiments further comprise a fifth TSV in the first die and a sixth TSV in the second die. The third source is connected to a node in the first die by path including the fifth and sixth TSVs, at least one of a contact, a via or a conductive line in the second die and at least one of a contact, a via or a conductive line in the third die.

Some embodiments further comprise a fifth TSV in the first die and a sixth TSV in the second die. The first drain is connected to a node in the third die by a path including the fifth and sixth TSVs, at least one of a contact, a via or a conductive line in the first die and at least one of a contact, a via or a conductive line in the second die.

In some embodiments, the first drain is directly above the second drain and third drain, the first gate electrode is directly above the second gate electrode and third gate electrode, and the first source is directly above the second source and third source.

Some embodiments further comprise a third device on the first die, the third device having the first source of the first device as a third drain of the third device, the third device further comprising a third source and a third gate electrode above a third channel region between the third source and the third drain.

Some embodiments further comprise a fourth device on the second die, the fourth device having the second drain of the third device as a fourth source of the fourth device, the fourth device further comprising a fourth drain and a fourth gate electrode above a fourth channel region between the fourth source and the fourth drain. The third gate is connected to the fourth gate by a path including a third TSV.

Some embodiments further comprise a third device on the first die, the third device having a third drain and a third gate electrode above a third channel region between the third source and the third drain. The first gate electrode and the third gate electrode are connected by one or more of a contact, a via or a conductive line in an interconnect structure of the first IC die. The first drain and the third drain are connected by one or more of a contact, a via or a conductive line in the interconnect structure of the first IC die.

In some embodiments, a three dimensional integrated circuit (3D IC) comprises a first integrated circuit (IC) die having at least a first transistor comprising a first gate electrode; and In some embodiments, a second IC die has at least a second transistor comprising a second gate electrode, the second gate electrode connected to the first gate electrode by a path including a first through substrate via (TSV), the second transistor connected in series to the first transistor by a path including a second TSV.

In some embodiments, the first transistor is directly above the second transistor.

In some embodiments, the first gate electrode is above a first channel region. The second gate electrode is above a second channel region. The first TSV is formed outside of the first and second channel regions.

Some embodiments further comprise a third IC die having at least a third transistor comprising a third gate electrode above a third channel region, the third gate electrode connected to the second gate electrode by a path including a third TSV, the second and third transistors connected in series by a path including a fourth TSV.

Some embodiments further comprise The 3D IC of claim 14, further comprising a fifth TSV in the first die and a sixth TSV in the second die. The third transistor has a source connected to a node in the first die by the fifth and sixth TSVs, at least one of a contact, a via or a conductive line in the second die and at least one of a contact, a via or a conductive line in the third die.

Some embodiments further comprise a fifth TSV in the first die and a sixth TSV in the second die. The first transistor is connected to a node in the third die by the fifth and sixth TSVs, at least one of a contact, a via or a conductive line in the first die and at least one of a contact, a via or a conductive line in the second die.

In some embodiments, a method comprises joining a first integrated circuit (IC) die having at least a first transistor comprising a first gate electrode to a second IC die having at least a second transistor comprising a second gate electrode. The joining includes connecting the second gate electrode to the first gate electrode by a path including a first through substrate via (TSV), and connecting the second transistor in series with the first transistor by path including a second TSV.

In some embodiments, the first transistor has a source, the second transistor has a drain, and the first IC die further comprises at least one of a contact, a conductive line, or a via connecting the source of the first transistor to the second TSV. The second IC die further comprises at least one of a contact, a conductive line, or a via connecting the drain of the second transistor to the second TSV.

In some embodiments, the first IC die further comprises an additional transistor having an additional gate electrode and an additional drain. The method further comprises connecting the first gate electrode and the additional gate electrode by one or more of a contact, a via or a conductive line in an interconnect structure of the first IC die; and connecting the first drain and the additional drain by one or more of a contact, a via or a conductive line in the interconnect structure of the first IC die.

Some embodiments further comprise joining the second IC die to a third IC die having at least a third transistor comprising a third gate electrode, the joining including: connecting the second gate electrode to the third gate electrode by a path including a third through substrate via (TSV), and connecting the third transistor in series with the second transistor by path including a fourth TSV.

In some embodiments, a method comprises joining a first integrated circuit (IC) die having at least a first transistor comprising a first gate electrode and a second transistor having a second gate electrode to a second IC die having at least a third transistor comprising a third gate electrode, and a fourth transistor having a fourth gate electrode. The joining includes: connecting the first, second, third and fourth gate electrodes to each other using at least a first through substrate via (TSV) and a second TSV, and connecting the second transistor in series with the third transistor by a path including a third TSV.

In some embodiments, a method comprises joining a first integrated circuit (IC) die having at least a first transistor comprising a first gate electrode and a second transistor having a second gate electrode to a second IC die having at least a third transistor comprising a third gate electrode, and a fourth transistor having a fourth gate electrode. The joining includes: connecting the first, second, third and fourth gate electrodes to each other using at least a first through substrate via (TSV) and a second TSV, connecting the source of the second transistor with the drain of the third transistor by a path including at least a third TSV; and connecting the drain of the first transistor with the drain of the second transistor.

Although the subject matter has been described in terms of exemplary embodiments, it is not limited thereto. Rather, the appended claims should be construed broadly, to include other variants and embodiments, which may be made by those of ordinary skill in the art.

What is claimed is:

1. A method comprising joining a first integrated circuit (IC) die having at least a first transistor comprising a first gate electrode to a second IC die having at least a second transistor comprising a second gate electrode, the joining including:
    electrically connecting the second gate electrode to the first gate electrode by a path including a first through substrate via (TSV), and
    electrically connecting the second transistor in series with the first transistor by path including a second TSV, wherein the step of electrically connecting the second transistor in series includes: forming the second TSV with an offset from a source of the first transistor and a drain of the second transistor, forming respective contacts on the source of the first transistor and the drain of the second transistor, and forming respective conductive lines in respective interconnect layers above the source of the first transistor and the drain of the second transistor, for coupling the contact on the source to the contract on the drain.

2. The method of claim 1, wherein:
    the first IC die further comprises at least one of a contact or a via coupling the source of the first transistor to the second TSV, and
    the second IC die further comprises at least one of a contact or a via coupling the drain of the second transistor to the second TSV.

3. The method of claim 2, wherein the first IC die further comprises an additional transistor having an additional gate electrode and an additional drain, further comprising:
    coupling the first gate electrode and the additional gate electrode by one or more of a contact, a via or a conductive line in an interconnect structure of the first IC die; and
    coupling the first drain and the additional drain by one or more of a contact, a via or a conductive line in the interconnect structure of the first IC die.

4. The method of claim 1, further comprising:
    joining the second IC die to a third IC die having at least a third transistor comprising a third gate electrode, the joining including:
    coupling the second gate electrode to the third gate electrode by a path including a third through substrate via (TSV), and
    coupling the third transistor in series with the second transistor by path including a fourth TSV.

5. The method of claim 4, further comprising forming a third TSV coupling a source of the second transistor with a node in the first IC die.

6. The method of claim 4, further comprising forming a third TSV coupling a drain of the first transistor with a node in the second IC die.

7. A method comprising
    joining a first integrated circuit (IC) die having at least a first transistor comprising a first gate electrode to a second IC die having at least a second transistor comprising a second gate electrode, the joining including:
    electrically connecting the second gate electrode to the first gate electrode by a path including a first through substrate via (TSV), wherein the first TSV is electrically connected to a portion of the first gate electrode beyond an edge of an active region containing a drain, a channel and a source of the first transistor, and
    electrically connecting the second transistor in series with the first transistor by path including a second TSV.

8. A method comprising
    joining a first integrated circuit (IC) die having at least a first transistor comprising a first gate electrode and a second transistor having a second gate electrode to a second IC die having at least a third transistor comprising a third gate electrode, and a fourth transistor having a fourth gate electrode, the joining including:
    electrically connecting the first, second, third and fourth gate electrodes to each other using at least a first through substrate via (TSV) and a second TSV, and
    electrically connecting the second transistor in series with the third transistor by a path including a third TSV.

9. The method of claim 8, wherein the first and second transistors share a source/drain region between the first gate electrode and the second gate electrode.

10. The method of claim 8, wherein the third and fourth transistors share a source/drain region between the third gate electrode and the fourth gate electrode.

11. The method of claim 8, wherein the first TSV electrically connects the first gate electrode to the fourth gate electrode, and the second TSV electrically connects the second gate electrode to the third gate electrode.

12. The method of claim 11, wherein an interconnect path within the first IC die electrically connects the first gate electrode to the second gate electrode.

13. A method comprising
    joining a first integrated circuit (IC) die having at least a first transistor comprising a first gate electrode and a second transistor having a second gate electrode to a second IC die having at least a third transistor comprising a third gate electrode, and a fourth transistor having a fourth gate electrode the joining including:
    electrically connecting the first, second, third and fourth gate electrodes to each other using at least a first through substrate via (TSV) and a second TSV,
    electrically connecting the source of the second transistor with the drain of the third transistor by a path including at least a third TSV; and
    electrically connecting the drain of the first transistor with the drain of the second transistor.

14. The method of claim 13, wherein the drains of the first and second transistors are electrically connected to each other by an interconnect within the first IC die.

15. The method of claim 14, further comprising:
    joining a third integrated circuit (IC) die having at least a fifth transistor comprising a fifth gate electrode and a sixth transistor having a sixth gate electrode to the second IC die;
    electrically connecting a fifth gate electrode of the fifth transistor to the fourth gate electrode using a fourth TSV; and
    electrically connecting a sixth gate electrode of the sixth transistor to the third gate electrode using a fifth TSV.

16. The method of claim 15, further comprising electrically connecting a source of the fifth transistor to the drain of the sixth transistor.

17. The method of claim 16, wherein the sources of the fifth and sixth transistors are electrically connected to each other by an interconnect within the third IC die.

18. The method of claim 15, wherein the first, fourth, and fifth transistors are electrically connected to each other in series, and the second, third and sixth transistors are electrically connected to each other in series.

19. The method of claim 13, further comprising electrically connecting the source of the first transistor with the drain of the fourth transistor by a path including at least a fourth TSV.

* * * * *